(12) United States Patent
Palmer et al.

(10) Patent No.: US 8,222,671 B2
(45) Date of Patent: Jul. 17, 2012

(54) POWER SEMICONDUCTOR DEVICES

(75) Inventors: Patrick Reginald Palmer, Cambridge (GB); Zhihan Wang, Cambridge (GB)

(73) Assignee: Cambridge Enterprises Limited, Cambridge (GB)

( * ) Notice: Subject to any disclaimer, the term of this patent is extended or adjusted under 35 U.S.C. 154(b) by 306 days.

(21) Appl. No.: 11/687,349

(22) Filed: Mar. 16, 2007

(65) Prior Publication Data
US 2007/0221949 A1 Sep. 27, 2007

Related U.S. Application Data

(60) Provisional application No. 60/784,201, filed on Mar. 21, 2006.

(51) Int. Cl.
*H01L 29/74* (2006.01)
(52) U.S. Cl. .......................................... 257/133; 257/83
(58) Field of Classification Search ................... 257/133, 257/115, 157, 183, 192, 194, 280, 471, 477
See application file for complete search history.

(56) References Cited

U.S. PATENT DOCUMENTS

| | | | | |
|---|---|---|---|---|
| 3,634,739 A * | 1/1972 | Borchert et al. | ............... | 257/163 |
| 4,281,336 A * | 7/1981 | Sommer et al. | ............... | 257/156 |
| 4,827,321 A * | 5/1989 | Baliga | ............... | 257/133 |
| 4,958,211 A * | 9/1990 | Temple | ............... | 257/133 |
| 5,243,201 A * | 9/1993 | Bauer | ............... | 257/135 |
| 5,463,344 A * | 10/1995 | Temple | ............... | 327/374 |
| 5,616,938 A | 4/1997 | Bauer | | |
| 5,943,200 A * | 8/1999 | He | ............... | 361/56 |
| 6,717,182 B1 * | 4/2004 | Tagami et al. | ............... | 257/83 |

FOREIGN PATENT DOCUMENTS
EP 0 697 736 A2 2/1996

OTHER PUBLICATIONS

"Clustered insulated gate bipolar transistor: a new power semiconductor device" by M. Sweet IEE Proc.—Circuits Devices Syst., vol. 148, No. 2, Apr. 2001.*
"A Comparative Study of the Transient Response of GTO Thyristors" by Garrett et al. Solid-State Electronics vol. 39, No. 1, pp. 137-146, 1996.*
"Clustered insulated gate bipolar transistor: a new power semiconductor device" by Sweet et al. IEE Proc.—Circuits Devices Syst., vol. 148, No. 2, p. 75, Apr. 2001.*
"Clustered insulated gate bipolar transistor: a new power semiconductor device" by Sweet M. IEE Proc.—Circuits Devices Syst., vol. 148, No. 2, p. 75, Apr. 2001.*
Sweet et al. ("Clustered insulated gate bipolar transistor: a new power semiconductor device" IEE Proc.—Circuits Devices Syst., vol. 148, No. 2, p. 75, Apr. 2001).*
Li, et al.: "Series and Parallel Operation of the Emitter Turn-Off (ETO) Thyristor"; IEEE Transactions on Industry Applications, vol. 38, No. 3, May/Jun. 2002; p. 706-712.
Zhou, et al.: "Parallel Operation of the Emitter Turn-Off (ETO) Thyristor"; Center for Power Electronics Systems (CPES), The Bradley Department of Electrical and Computer Engineering, Virginia Polytechnic Institute and State University, Blacksburg, VA 24061-0111; IEEE 2002; p. 2592-2596.

* cited by examiner

*Primary Examiner* — Marcos D. Pizarro
*Assistant Examiner* — Suian Tang (57) ABSTRACT

This invention generally relates to power semiconductor devices, and in particular to improved thyristor devices and circuits. The techniques we describe are particularly useful for so-called MOS-gated thyristors. We describe a thyristor comprising a plurality of power thyristor devices connected in parallel, each said thyristor device being operable at a device current which the device has an on-resistance with a positive temperature coefficient.

16 Claims, 7 Drawing Sheets

POWER SEMICONDUCTOR DEVICES

RELATED APPLICATIONS

This application is related to the following British patent application Serial No. GB0605632.9 filed Mar. 21, 2006 and U.S. Provisional patent application Ser. No. 60/784,201, filed Mar. 21, 2006; and which are incorporated herein by reference.

FIELD OF THE INVENTION

This invention generally relates to power semiconductor devices, and in particular to improved thyristor devices and circuits. The techniques we describe are particularly useful for so-called MOS-gated thyristors.

BACKGROUND TO THE INVENTION

Among existing power semiconductor devices, thyristors are one of the oldest types, which have superior on-state losses and the highest power-handling capability. However, thyristors have many drawbacks, such as slow switching speed, complicated current gate control and di/dt and dv/dt limitations. It would be beneficial to be able to connect thyristors in parallel, but this results in current crowding, and generally the hottest device takes substantially all the current, resulting in thermal runaway.

In recent years there have been considerable improvements in the manufacture of IGBTs, which become the device of choice for the applications from 600V to 4000V. Advanced IGBTs enable fully controllable capability, simple MOS gate drive, fast switching performance and paralleling capability. Such devices do, however, have problems associated with them, as when the blocking voltage increases, the on-state voltage drop increases dramatically preventing their extending into the high voltage applications.

MOS-gated thyristors have attracted considerable attention for high power applications in the past two decades, as they may combine advantages of IGBTs and thyristors. The devices can potentially have good conduction properties, the high input impedance of a MOSFET, fast switching speed, improved di/dt and dv/dt ratings, and also potentially good serial and parallel connection capability. Moreover, the adoption of IGBT fabrication processes can lead to easier manufacturing and lower cost. However, it has proved difficult in practice to produce a device which reliably meets the conflicting requirements mentioned above.

Many device structures have been proposed, such as MOS-controlled thyristor and emitter-switched thyristor. Those proposed devices either have a high on-state voltage drop due to the addition of a MOSFET in series with the thyristor structure, or have a complex fabrication process and drive circuitry due to dual gates or additional silicon layers. Moreover it has proved difficult to adapt an IGBT process for the fabrication of thyristor devices. The modern IGBT fabrication adopts the processes of an IC foundry and the area of an IGBT chip is limited within 2 cm$^2$ due to the demand for high yield. Therefore, thousands of cells are connected in parallel in a chip and several chips in a module. However, the paralleling of thyristors has many difficulties including both turn-on and turn-off failures, as well as uneven current sharing. Because of these and other problems, no MOS-gated thyristor is yet commercially available. Some recently developed thyristor-type devices, such as IGCT and ETO, also have respective drawbacks.

Background thyristor prior art can be found in U.S. Pat. No. 5,616,938 and U.S. Pat. No. 5,324,670. Further background prior art can be found in: U.S. Pat. No. 6,952,335; U.S. Pat. No. 6,933,541; U.S. Pat. No. 6,710,639; "Parallel operation of the emitter turn-off (ETO) thyristor", Industry Applications Conf., 2002, Record of the 37th IAS Annual Meeting, Vol 4, pages 2592-2596, Xigen Zhou et al, 13-18th Oct. 2002; and "Series and parallel operation of the emitter turn-off (ETO) thyristor" IEEE Transactions on Industry applications, Vol 38, No 3, May/June 2002, pp 706-712, Yuxin Li et al.

The present invention seeks to provide an improved structure for power semiconductor devices, which addresses the aforementioned problems.

SUMMARY OF THE INVENTION

According to a first aspect of the invention there is therefore provided a thyristor comprising a plurality of power thyristor devices connected in parallel, each said thyristor device being operable at a device current at which the device has an on-resistance with a positive temperature coefficient.

Preferably each of the power thyristor devices is operable, with a positive temperature coefficient for the on-resistance at a current of less than 10 kA, more preferably less than 1 kA, most preferably less than 100 A. We will describe embodiments of a thyristor device which are able to provide a positive temperature coefficient at a device current of at least 1 A, 10 A, 25 A, 100 A and above.

The thyristor may comprise a plurality of dies within a single package, each die bearing a thyristor device. The devices are connected in parallel by connecting their respective anode, cathode and gate connections. Gate resistors may be included when connecting the thyristor devices in parallel.

Preferably each thyristor device has a gate width of between 50 µm and 1000 µm; preferably the gate width is greater than 150 µm. Preferably a MOS (metal oxide semiconductor) gate structure is employed which facilitates us of an IGBT (insulated gate bipolar transistor) fabrication process. A thyristor device may comprise multiple thyristor cells connected in parallel. Use of a wide gate structure facilitates a small latching current, clean turn-on, positive temperature coefficient, and high current and voltage slew rate capability. Broadly speaking, as the gate width increases so more P-i-N diode appears in series with the channel, facilitating achieving the desired temperature coefficient. A wide gate structure also facilitates rapid turn on and, in preferred embodiments, each thyristor device has a turn-on time of less than 10 µs. Some preferred embodiments have a turn-on time of less than 2 µs.

Preferred embodiments of the device we describe are modelable as a thyristor connected in parallel with a resistor (which includes a MOSFET channel).

Thus the invention further provides a MOS-gated thyristor device modelable as a thyristor connected in parallel with a resistor, and wherein said resistor includes a channel of a MOS transistor driven by said MOS gate.

The channel carries the device current during the turn-on phase.

In preferred embodiments the resistor includes a resistance of a drift region of the thyristor. Preferably both the thyristor and the channel of the MOS transistor can each carry a current of at least 1 A, more preferably at least 10 A, most preferably at least 30 A.

A conventional thyristor is typically driven with a voltage of around 5V, but this is generally too low for a MOS-gated device. Thus we will also describe a gate drive circuit to enable an embodiment of the device we describe to function substantially as a drop-in replacement for a conventional thyristor.

Thus in a further aspect the invention provides a combination of a MOS-gated thyristor and drive circuit, said drive circuit having a gate input, and said drive circuit is configured to step up a voltage on said gate input to provide a gate drive to said MOS gate of said thyristor.

Preferably the drive circuit includes a charge storage capacitor coupled to the gate input and an energy storage inductor to provide a voltage for charging the capacitor. In some preferred embodiments this inductor comprises a stray inductance associated with the thyristor packaging. In particular paralleled devices may be successfully turned on with a small inductance connected to each anode which may be provided by stray inductance of the packaging so that no paralleling snubber is required.

Preferably the drive circuit further comprises a bypass diode connected between the gate input and the capacitor. Optionally the thyristor and drive circuit may be fabricated on a common substrate. In preferred embodiments the circuit enables the MOS-gated thyristor to be driven with a voltage of around 4V to 8V, for example 5V to 6V.

In another aspect the invention provides a method of fabricating a power thyristor, the method comprising connecting a plurality of thyristor devices in parallel, each said thyristor having a maximum current rating and having an on-resistance with a positive temperature coefficient at said maximum current rating.

The invention further provides a method of operating a power thyristor comprising a plurality of thyristor devices connected in parallel, the method comprising a passing a current through said power thyristor, when said power thyristor and said thyristor devices are in an on state, such that each of said thyristor devices has an on-resistance with a positive temperature coefficient.

According to a still further aspect of the invention, there is provided a semiconductor device comprising a semiconductor body having formed therein a thyristor having a first region of conductivity type provided with a first main electrode, a second region of the opposite conductivity type forming first pn junction with the first region, a third region of the one conductivity type forming a second pn junction with the second region and provided with a gate electrode, and a fourth region of the opposite conductivity type forming a third pn junction with the third region and having an electrical connection to a second main electrode.

The gate electrode of the third region may comprises an insulated gate overlaying a channel area of the third region for defining a conductive path for charge carriers of the opposite conductivity type from the fourth region into the second region as base current for initalising thyristor action.

The first and second main electrodes may be provided on opposed surfaces of the semiconductor body so forming a vertical device. They may also provide on the same surfaces of the semiconductor body so forming a lateral device.

This may have a cell structure with dimensions comparable or larger than an IGBT cell. Cells are connected in parallel to form a chip with limited area for high yield. High current-rating modules are formed by paralleling several chips together. This structure facilitates adoption of an IGBT fabrication process.

The forth region may have a wide structure which contacts the second main electrode. The third region may also have a wide structure which is beneath the fourth region. This structure may be termed wide base structure. The wide structure of the third and the fourth regions may cause a sufficiently large so-called pinch resistance, that a voltage drop may be developed when a current flows to forward bias the third pn junction to latch up the device. When the third region is wide enough, the current required to latch up the device may be low enough. When the third region is narrow enough, the dv/dt limitation may be high enough. Therefore, a good trade off may be achieved, to concurrently have low latching current and high dv/dt rating.

The insulated gate may have a wide structure which may also have a wide contact with the second region. This structure may be termed a wide gate structure. The structure under the wide gate may have a so-called P-i-N diode effect, which may have a positive on-state resistance temperature coefficient. Hence the total temperature coefficient may become positive, for example, given a wide enough gate structure, i.e. a large enough P-i-N diode proportion to the whole device, (in contrast to the negative temperature coefficient in conventional thyristors, which causes current crowding in hotter devices). The wide gate structure may slightly increase on-state resistance, resulting in a very low spike current during latch up and improved paralleling turn on. The capacitance between the gate and the first electrode may be increased, which may reduce the Q factor of LCR series circuit during paralleling turn off. Hence the turn-off oscillation problem may be improved as well.

In embodiments an equivalent on-state voltage drop to conventional thyristors, a positive on-state resistance temperature coefficient, a small latching current and a small spike voltage during latch up may be provided. As previously mentioned, paralleled devices may be successfully turned on with small inductance of "IGBT" packaging. Current rating may be greatly increased by paralleling several chips in one module without too much increase in the cost and size of the system.

Broadly speaking when we refer to power devices we are generally referring to high current and/or voltage devices, typically operating with a voltage of greater than 100V and/or a current of greater than 10 A and/or at a power of greater than 1 Watt, 10 Watts or 100 Watts.

The above-mentioned techniques may be employed with a range of thyristor devices not limited to MOS-gate devices and including, for example, a light-triggered thyristor, GTO, SGTO, lateral inversion layer emitter thyristor (LILET), IGCT, ETO, EST, or DGEST.

The invention further provides aspects of the invention as described above in which the thyristor and/or thyristor devices are substituted by other power devices, for example IGBTs, MOSFETs, SCR rectifiers and the like, including both lateral and vertical devices, and trench-isolated devices.

BRIEF DESCRIPTION OF THE DRAWINGS

These and other aspects of the invention will now be further described, by way of example only, with reference to the accompanying figures in which.

DETAILED DESCRIPTION OF PREFERRED EMBODIMENTS

Broadly speaking we will describe a single gate MOS-gated thyristor with superior paralleling capability and an equivalent conduction property to conventional thyristors. With modified device structure and parameters, such as the wide gate and wide P base structure, superior characteristics are achieved. Due to the positive on-state resistance temperature coefficient and clean turn on characteristic, the devices can be fabricated using normal IGBT manufacturing process. Several chips can be connected in parallel in a module to enable high current handling capability while maintaining high manufacturing yield. The device demonstrates a potential to replace conventional thyristors for high power applications.

A half-cell structure of our MOS-gated thyristors has a basic PNPN thyristor structure and a MOS gate, which is similar to an IGBT. However, several important aspects have been changed and it possesses significant improvements. The pitch of the unit cell may range from 200 μm to 700 μm, 10 or more times that of an ordinary IGBT, and the widths of both the MOS gate and P base are significantly increased.

The bottom layer is a thin P emitter layer connected to the anode. The layer may be called transparent anode structure. The thick N− drift region above the P emitter layer is lightly doped forming two PN junctions with the P emitter layer and the P base layer respectively. A highly doped N+ region is above the P base layer and is connected to the cathode of the device. It forms the third PN junction with the P base layer. The gate electrode comprises an insulated gate overlaying a channel area in the P base for defining a conductive path for charge carriers from the N+ emitter region into the N− drift region as base current for initiating thyristor action.

Figure 1:
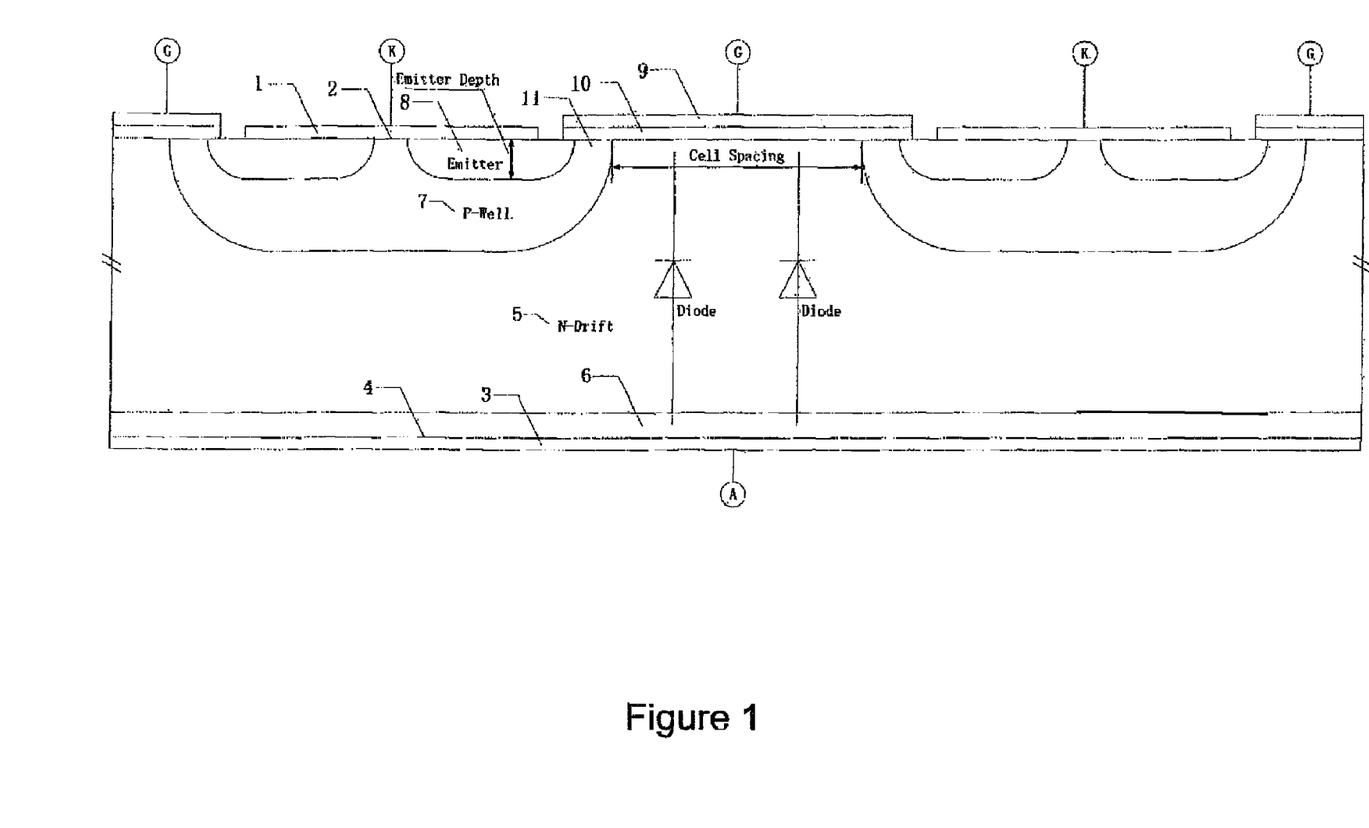
FIG. 1 shows a schematic cross-sectional view of an embodiment of semiconductor devices according to the invention.

Thus referring to FIG. 1, a cross-sectional view of the full cell structure of a high power MOS-gated thyristor type semiconductor device is shown. A silicon body is provided with a cathode electrode 1 (for example, 350 μm wide) at a first surface 2 thereof and an anode electrode 3 at a second, opposite, surface 4 thereof. Typically the silicon body is formed from a flat relatively thin slice of silicon having an n-conductivity type, into which various conductivity modifying materials are introduced to form a succession of electrically different regions. Alternatively the silicon body is formed by the p anode region onto/into which the other regions are grown or diffused. In the drawing, the bulk of the device comprises the n-region 5, having relatively thin layer 6 of p+ material between it an the anode electrode 3.

A region 7 of p type material in the form of a well is provided between the first surface 2 and n-region 5. A cathode n+ type region 8 is formed beneath the first surface 2 and above p type region 7.

The region 9 is a region of doped polysilicon which constitutes a gate electrode (for example, 150 μm wide) which has a thin oxide layer 10 positioned between it and silicon body, with which part of n-region 5, p type region 7 and n+ region 8 have contact.

An example set of parameters of an embodiment with a 2000V rating may be: a carrier lifetime in the range of 0.1 μs to 100 μs, preferably between 1 μs to 10 μs; a P anode emitter doping in the range of 1 e17/cm$^3$ to 1 e19/cm$^3$, and a dimension in the range of 0.5 μm to 2 μm; a N+ cathode emitter doping in the range of 1 e18/cm$^3$ to 1 e20/cm$^3$, and a dimension in the range of 0.5 μm to 3 μm; a N− drift region doping of about 5 e13/cm$^3$, and a dimension of about 280 μm.

Figure 2:
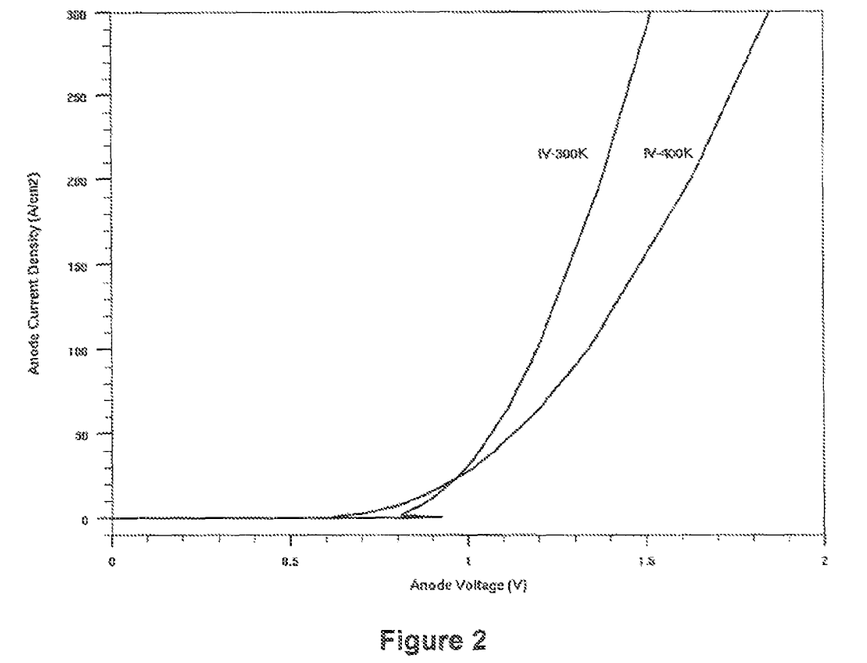
FIG. 2 shows I-V characteristics of a thyristor device according to an embodiment of the invention.
Figure 3:
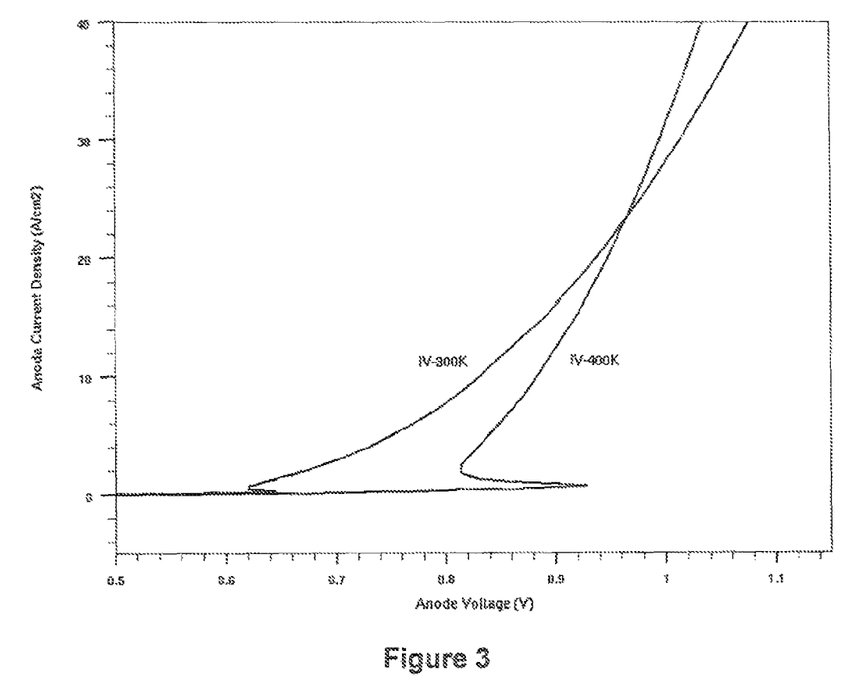
FIG. 3 shows an enlargement of FIG. 2.

FIG. 2 shows the I-V characteristics of the device at different temperatures (300K and 400K). FIG. 3 shows the spike voltage during latch up at 300K. The forward voltage drop is only 1.38V at 200 A/cm2, which is similar to conventional thyristors and superior to IGBTs and other proposed MOS-gated thyristors. A positive on-state resistance temperature coefficient is also demonstrated.

Analysis of the Structure
Wide P Base Structure

As shown in FIG. 1, the widths of both the MOS gate and P base are significantly increased. Wide and lightly doped P-base causes a sufficiently large so-called pinch resistance (lateral resistance of the P base), which is used for the device latch-up. When the device is turned on by applying a positive voltage to the gate, an N-channel is formed under the gate and the electrons flow from the N+ emitter region into the N− drift region through the channel. Holes coming from the anode are attracted to the drift region beneath the gate and then flow laterally through the P base and reach the cathode via the P base cathode shorting. The device now works in IGBT mode. As the anode current increases above the latching current, the lateral voltage drop across the P base is high enough to forward bias the PN junction. Hence the device latches up and enters the thyristor mode.

When the pinch resistance is sufficiently large, i.e. the P base is sufficiently wise and lightly-doped, only a small anode current can forward bias the PN junction and latch up the device. However, there is a tradeoff between latching current and dv/dt limitation. If the pinch resistance is too large, the dv/dt characteristic will be degraded. A compromise may be achieved for the P-base structure to realize low latching current, usually below 1 A, while maintain high dv/dt rating.

Wide Gate Structure

The wide-gate structure has significant effects on device characteristics. Increasing the gate width can reduce the spike voltage and latching current. It not only reduces switching losses, but also aids the current sharing between paralleled devices during turn-on. The wide gate structure also facilitates making the device on-state resistance temperature coefficient from negative to positive (will be discussed in the following section), which further improves the paralleling capability. The capacitance between the gate and the anode is also increased, which may reduce the Q factor of LCR series circuit during paralleling turn off. Hence the turn-off oscillation problem may be improved as well.

Temperature Coefficient

As can be seen in FIG. 2, there is a crosspoint between our device IV curves at 300K and 400K. The on-state resistance temperature coefficient is negative when the current density is below the crosspoint; and the coefficient turns to be positive when the current density is above the crosspoint, which is desirable for paralleling performance. In fact, thyristors and IGBTs have a crosspoint in their IV characteristics. For conventional thyristors, the crosspoint is far above the rating current, while for IGBTs, it is fairly low. Therefore IGBTs often refers as having positive coefficient and conventional thyristors having negative one.

In regard to the device paralleling performance, we have the crosspoint well below the current rating, that is below the maximum rated operating current of the device at 25° C. It is demonstrated that there are three main factors relevant to the position of the crosspoint.

[1] Gate Width

Figure 12:
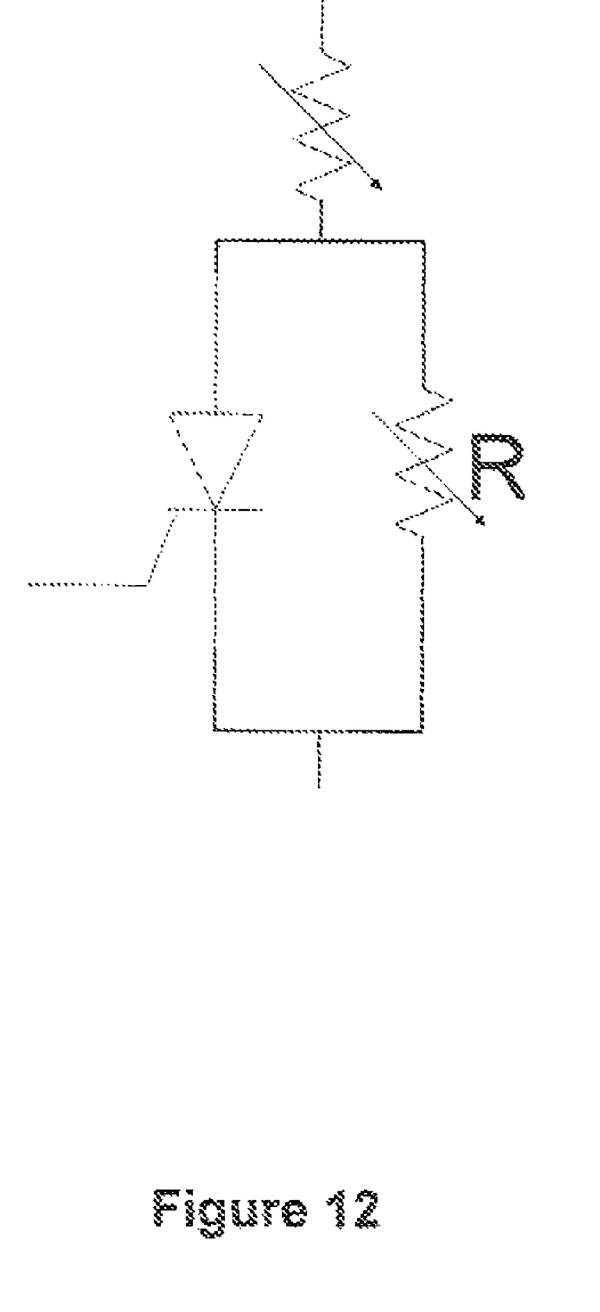
FIG. 12 shows a circuit model of an embodiment of a MOS-gated thyristor according to an embodiment of the invention.

In the device, the structure under the wide gate has the so-called P-i-N diode effect. The device can be modelled as a thyristor connected in parallel with a P-i-N diode in series with a MOS channel, as shown in FIG. 12. The P-i-N diode in series with a MOS channel has a positive coefficient in contrast to the negative temperature coefficient of the thyristor structure. Therefore the overall coefficient is dependent on the ratio of P-i-N diode to total cell pitch i.e. the ratio of the gate width to total cell pitch.

Figure 4:
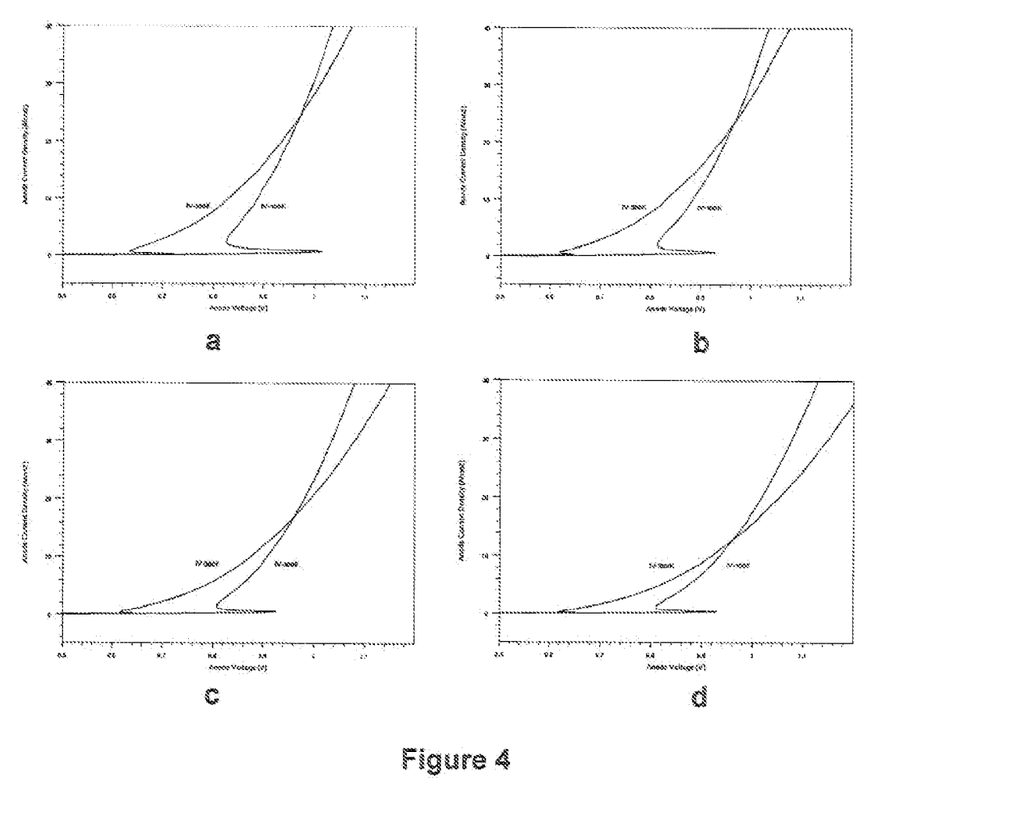
FIG. 4 shows I-V curves of thyristor devices with the same cathode width and carrier lifetime but different gate width.
Figure 5:
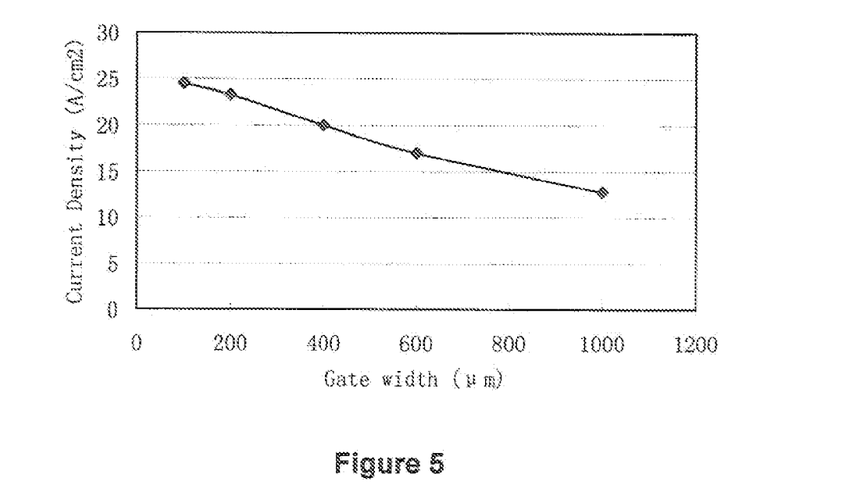
FIG. 5 shows the relationship between the gate width and the current density at the crosspoint.

FIGS. 4, a, b, c and d represent the I-V curves of thyristor devices at 300K and 400K with gate width of 100 μm, 200 μm, 600 μm and 1000 μm respectively. The crosspoint of the curves drops from 24.5 A/cm$^2$ to 12.8 A/cm$^2$ with increased gate width as shown in FIG. 5.

[2] Carrier Lifetime

Figure 6:
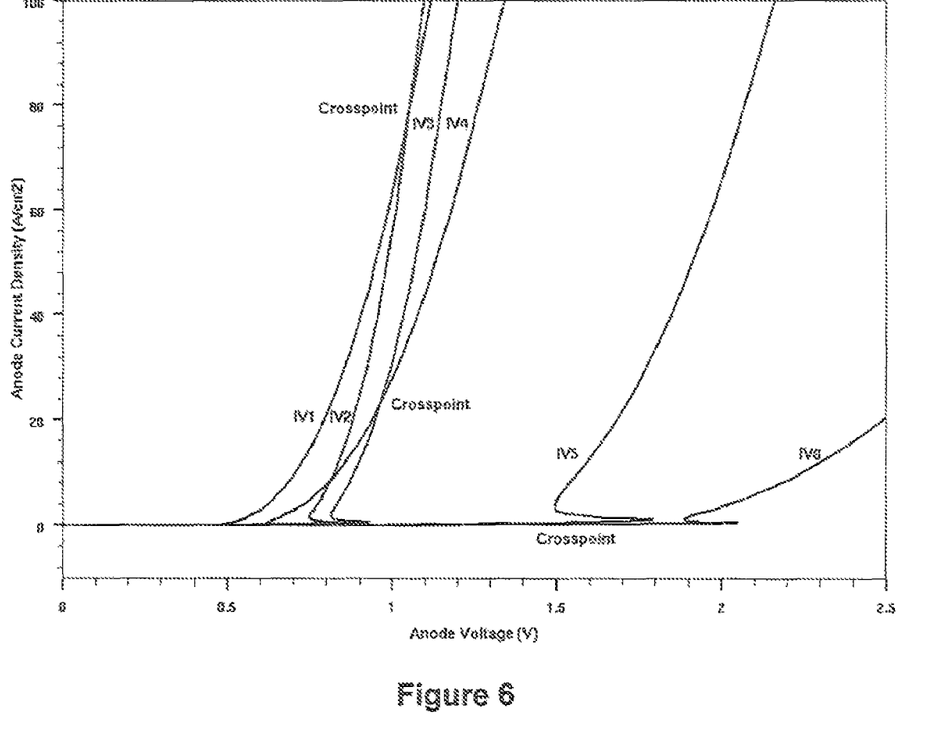
FIG. 6 shows I-V curves of thyristor devices with substantially the same structures but different carrier lifetime.
Figure 7:
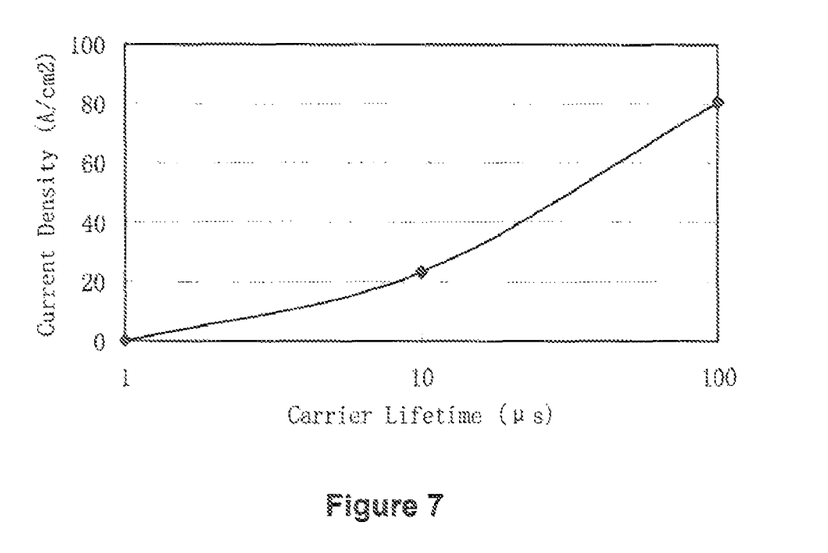
FIG. 7 shows the relationship between the carrier lifetime and the current density at the crosspoint.

Simulation results demonstrate that carrier lifetime has strong effect on the position of the crosspoint. In FIG. 6, IV1 and IV2 represent the thyristor devices with low carrier lifetime (100 μs) at 300K and 400K respectively; IV3 and IV4 represent the thyristor devices with medium carrier lifetime (10 μs) at 300K and 400K respectively; IV5 and IV6 represent the thyristor devices with low carrier lifetime (1 μs) at 300K and 400K respectively. It is shown in FIG. 7 that the crosspoint of the curves drops from 80.5 A/cm$^2$ to 23.3 A/cm$^2$ and finally to only 0.06 A/cm$^2$ with decreased carrier lifetime.

[3] Anode Injection Efficiency

The current density at crosspoint drops when the anode injection efficiency decreases. The anode injection efficiency is determined by the doping and dimension of the P emitter layer.

It is also demonstrated that when P-i-N diode ratio, carrier lifetime and anode injection efficiency are adjusted to decrease the position of the crosspoint, the on-state voltage drop increases accordingly. In conclusion, there is a tradeoff between the temperature coefficient and on-state voltage drop. Conventional thyristors trade off positive temperature coefficient for good conduction by using high carrier lifetime, while for our device, we may achieve a satisfying positive temperature coefficient without the great harm to the conduction property by choosing appropriate gate width, carrier lifetime, and anode injection efficiency. However, for example, PIN diodes may have a positive temperature coefficient of on-resistance which may be achieved in other ways than the three mentioned above, such as adjusting other dopings.

We now describe operation of the device.

Switching Performance

The switching operation of the device is straightforward. When a positive voltage is applied to the gate, the device turns on and initially works in the IGBT mode with small anode current. As the anode current increases above the latching current, the device latches up and enters the thyristor mode. Thereafter the gate voltage can be removed. The turn-off process is the same as the conventional thyristor. When the anode current reduces to below the holding current, either by line commutation or load resonance, the device leaves conductivity modulation and turns off with reverse recovery.

Paralleling Performance

Conventional thyristors have a negative on-state resistance temperature coefficient causing current crowding in hotter devices. Variations in turn-on time can cause late firing of some of the paralleled groups, effectively reducing the average current in those thyristors. Moreover, if one thyristor turns on much faster than the rest, it may take the majority of the current and thus prevent the turn-on of the remaining devices. The common method for thyristor paralleling is to use reliable heatsinks as well as connecting reactors in series with each device. However, the problem has still not been totally overcome.

Figure 8:
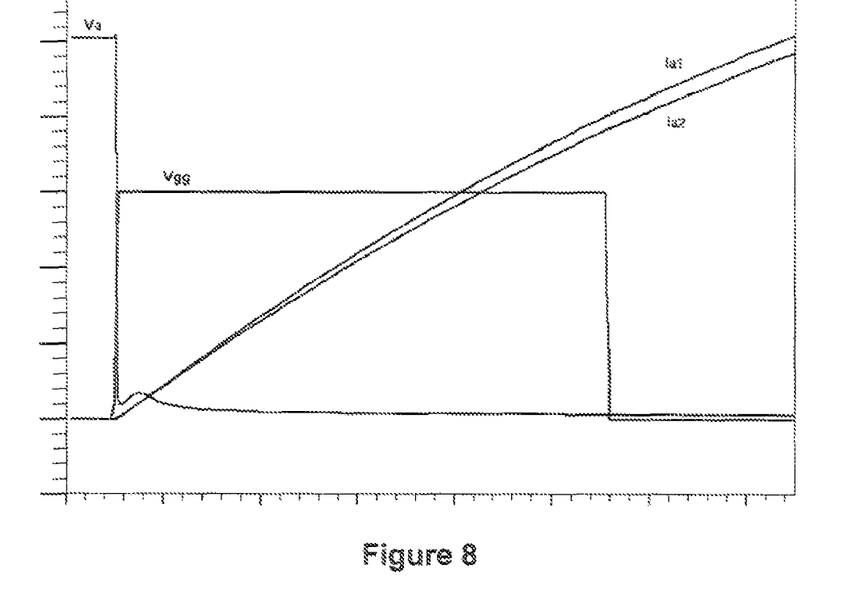
FIG. 8 shows successful turn-on transients of two paralleled wide-gate thyristor devices according to an embodiment of the invention (Va: 20V/div, Vgg: 5V/div, Ia1, Ia2: 10 A/div, t: 2 μs/div)
Figure 9:
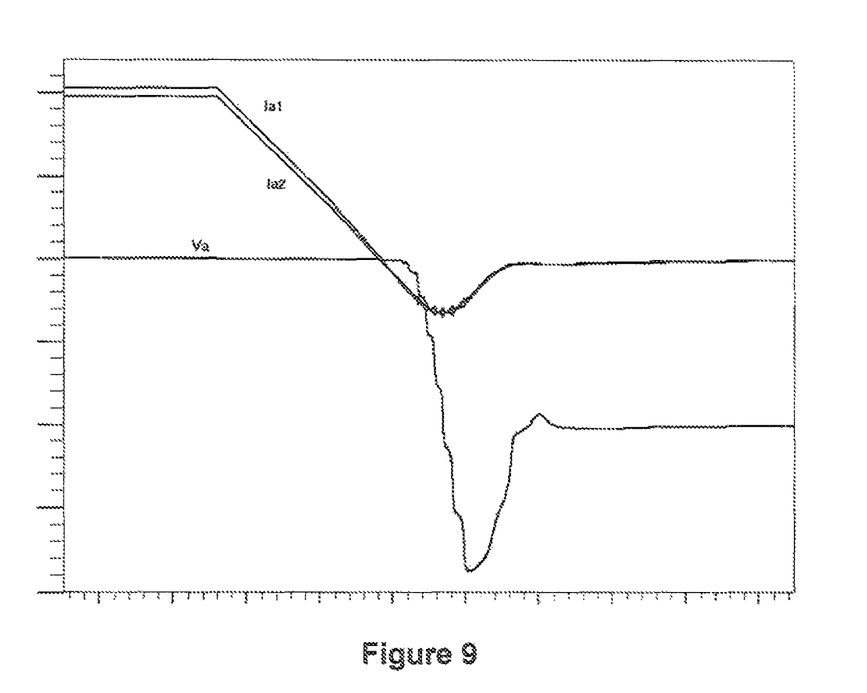
FIG. 9 shows successful turn-off transients of the two paralleled devices of FIG. 5 (Va: 250V/div, Ia1, Ia2: 50 A/div, T: 2 μs/div)

The positive on-state resistance temperature coefficient, as well as the small spike voltage during latch-up, makes the device superior for paralleling performance. The simulation results in FIG. 8 and FIG. 9 show that two paralleled devices with 5% doping and dimension variations have excellent current sharing during turn-on and turn-off transients. The two paralleled devices have a 20 nH inductance connected to each anode, which is a typical stray inductance of IGBT packaging. Depending on this stray inductance, no paralleling snubber is needed. Hence the cost and size of the system can be reduced. The variance in estimated turn-on and turn-off losses between the two devices makes up very small percentage of entire losses and may be considered minimal. Therefore the energy generated during the switching transient may not be a problem for paralleling.

Figure 10:
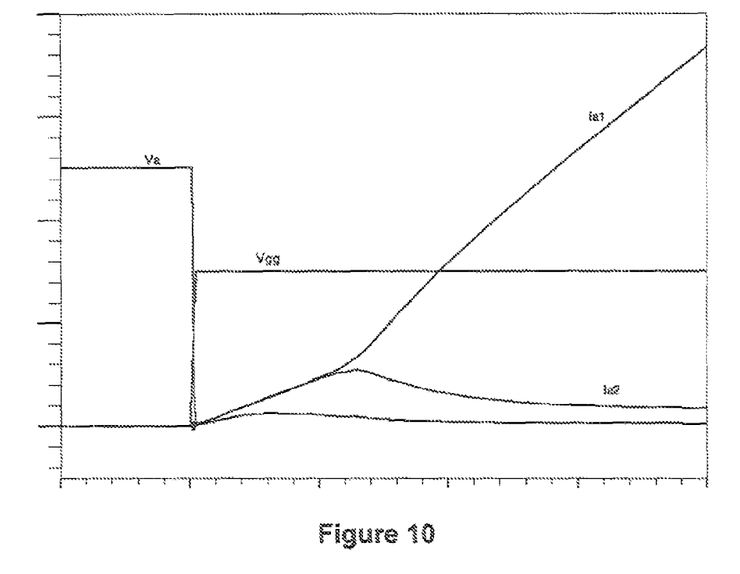
FIG. 10 shows turn-on failure of two conventional thyristor devices connected in parallel (Va: 40V/div, Vg: 10/div, Ia1, Ia2: 2 A/div, t: 2 μs/div)

FIG. 10 shows the turn-on failure of two paralleled devices with relatively narrow gate structure. One of the thyristors turns on faster than the other, thus it takes the majority of the current and prevent the turn-on of the remaining device. This is a problem for conventional thyristors.

We next describe a drive circuit.

In regard to the drive circuit, conventional thyristors use voltage source of about 6V to trigger, while for MOS-gated devices, the gate voltage required is about 15V. It is straightforward to use normal MOSFET or IGBT drive circuit to trigger our device. On the other hand, a gate drive circuit is supplied together with the device in order to enable the straightforward replacement of conventional thyristors by our devices. The drive circuit may be fabricated on a common substrate with the device.

Figure 11:
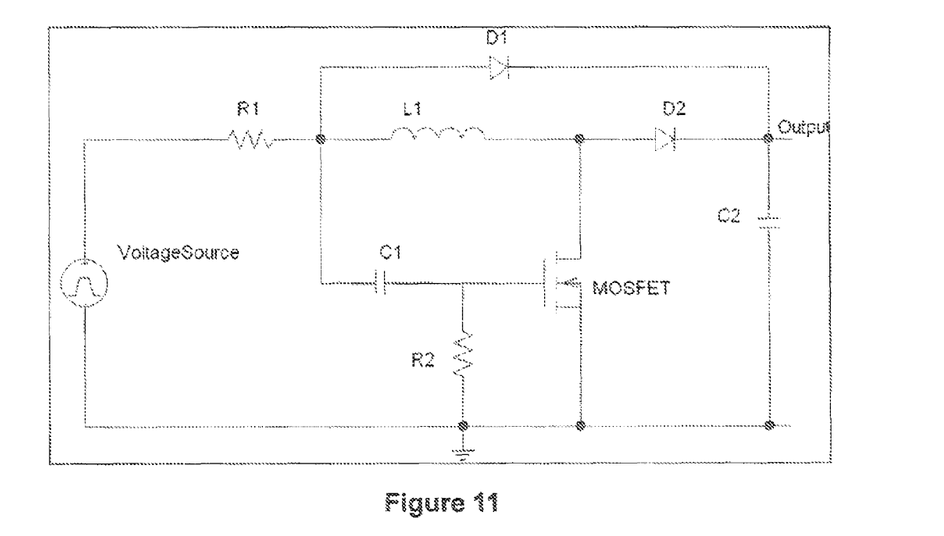
FIG. 11 shows an example of a drive circuit for a MOS-gated thyristor according to an embodiment of the invention.

FIG. 11 shows an example of the drive circuit which is a specifically designed boost circuit. The input of the circuit (~6V) is the conventional thyristor drive circuit, while the output provides 15V to drive the MOS gate of the device. The circuit is, broadly, a step-up converter with a bypass diode (D1); L1 may be provided by stray inductance. An example set of components values is as follows: 100 μH for L1, 1 μF and 5 nF for C1 and C2, and 10Ω and 100Ω for R1 and R2 respectively.

FIG. 12 shows a circuit model for an embodiment of a MOS-gated thyristor according to an embodiment of the invention. The resistors are variable to indicate that the thyristor can have an 'off' condition with a very high resistance. In some embodiments, however, it is possible to arrange for the channel to be on the whole time.

Embodiments of the above described device demonstrate favourable characteristics compared with conventional thyristors and other proposed MOS-gated thyristors for high voltage applications, such as an equivalent conduction property to conventional thyristors, clean turn-on characteristics, improved dv/dt and di/dt limitations, a small latching current, a small spike voltage during latch up, simple drive circuitry and reliable paralleling capability thanks to the positive on-state resistance temperature coefficient.

Reliable paralleling capability is attractive for power devices, as it is an effective way to provide high current handling capability of paralleling several chips in one module. Devices may be fabricated using normal IGBT processes. Paralleled devices may be successfully turned on with small inductance connected to each anode, which could be provided by stray inductance of IGBT packaging hence no paralleling snubber may be needed. The manufacturing cost of our device is also likely to be cheaper than an IGBT of a similar rating due to its simple cell structure and large cell pitch. The devices may replace conventional thyristors.

Applications include high voltage rectifiers, converters such as HVDC, and motor drive circuits.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A thyristor comprising:
a plurality of power thyristor devices connected in parallel, each said thyristor device configured to provide a device current at which the device has an on-resistance with a positive temperature coefficient; and
wherein each power thyristor device of the plurality of thyristor devices connected in parallel comprises a semiconductor body comprising:
a first region of a first conductivity type provided with a first main electrode;
a second region of a second conductivity type that is opposite the first conductivity type, the second region forming a first PN junction with the first region;
a third region of the first conductivity type forming a second PN junction with the second region and provided with a gate electrode; and
a fourth region of the second conductivity type forming a third PN junction with the third region and having an electrical connection to a second main electrode;
wherein the gate electrode of the third region comprises an insulated gate overlaying a channel area of the third region;
wherein the fourth region has a structure which contacts the second main electrode;
wherein the third region is beneath the fourth region;
wherein the thyristor has a cell spacing of greater than 300 um,
wherein the thyristor has a carrier lifetime of between 0.1 microseconds and 100 microseconds;
wherein a depth of an emitter of said thyristor is between 0.5 μm and 3 μm;
wherein a structure under the gate comprises a diode with a positive on-state resistance temperature coefficient; and
wherein each said device has a MOS gate having a width equal to or greater than said cell spacing and said width being a structural dimension of said MOS gate.

2. A thyristor as claimed in claim 1 wherein said device current is less than 10 kA.

3. A thyristor as claimed in claim 1 comprising a plurality of dies within a single package, each die bearing a said thyristor device.

4. A thyristor as claimed in claim 1 wherein said parallel connecting comprises connecting respective anode, cathode, and gate connections of each thyristor device in parallel.

5. A thyristor as claimed in claim 1 wherein each said thyristor device has a turn-on time of less than 10 μs.

6. A thyristor according to claim 1 and a drive circuit in combination, said drive circuit having a gate input, and said drive circuit is configured to step up a voltage on said gate input configured to provide a gate drive to the gate of said thyristor wherein said thyristor comprises a MOS gated thyristor.

7. A thyristor and drive circuit as claimed in claim 6 wherein said drive circuit includes a charge storage capacitor coupled to said gate input and an energy storage inductor configured to provide a voltage for charging said capacitor.

8. A thyristor and drive circuit as claimed in claim 7 wherein said inductor comprises a stray inductance of said thyristor packaging.

9. A thyristor and drive circuit as claimed in claim 7 further comprising a bypass diode connected between said gate input and said capacitor.

10. A thyristor and drive circuit as claimed in any one of claim 6 wherein said thyristor and said drive circuit are fabricated on a common substrate.

11. A thyristor as claimed in claim 1 wherein said device current is less than 1 kA.

12. A thyristor as claimed in claim 1 wherein said device current is less than 100 A.

13. A thyristor as claimed in claim 1, wherein a doping level of an emitter of a given thyristor of the plurality of power thyristors connected in parallel is in the range of 1e17/cm$^3$ to 1e19/cm$^3$.

14. A thyristor as claimed in claim 1, wherein each thyristor of the plurality of power thyristors connected in parallel has a planer gate structure.

15. A thyristor as claimed in claim 1, wherein the gate electrode of a given power thyristor of the plurality of power thyristors connected in parallel is on the same side of the given thyristor as a cathode electrode of the given thyristor.

16. A thyristor as claimed in claim 1, wherein, in of a given power thyristor of the plurality of power thyristors connected in parallel, the gate electrode overlaps each of (i) the second region, (ii) the third region and (iii) the fourth region.

* * * * *